United States Patent
Pharn et al.

(10) Patent No.: US 7,164,274 B2
(45) Date of Patent: Jan. 16, 2007

(54) CABLE DIAGNOSTICS USING TIME DOMAIN REFLECTOMETRY AND APPLICATIONS USING THE SAME

(75) Inventors: Art Pharn, Huntingdon Beach, CA (US); Peiqing Wang, Irvine, CA (US); Siavash Fallahi, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1 day.

(21) Appl. No.: 10/855,621

(22) Filed: May 28, 2004

(65) Prior Publication Data

US 2004/0251912 A1    Dec. 16, 2004

Related U.S. Application Data

(60) Provisional application No. 60/477,397, filed on Jun. 11, 2003.

(51) Int. Cl.
*G01R 31/02* (2006.01)
*G01R 31/11* (2006.01)

(52) U.S. Cl. .................. 324/534; 324/533; 324/539

(58) Field of Classification Search ............... 324/539, 324/534, 533, 532, 527, 522, 512, 500, 642, 324/637, 537; 73/620, 627; 702/159
See application file for complete search history.

(56) References Cited

U.S. PATENT DOCUMENTS

| | | | |
|---|---|---|---|
| 5,461,318 A * | 10/1995 | Borchert et al. ............ 324/533 |
| 5,514,965 A * | 5/1996 | Westwood .................. 324/533 |
| 5,521,512 A * | 5/1996 | Hulina ....................... 324/533 |
| 5,894,223 A * | 4/1999 | Medelius et al. ........... 324/529 |
| 6,643,595 B1 | 11/2003 | Rakshani et al. |
| 6,653,844 B1 * | 11/2003 | Wyar .......................... 324/533 |
| 6,697,768 B1 * | 2/2004 | Jones et al. ................. 702/189 |
| 6,822,457 B1 * | 11/2004 | Borchert et al. ............ 324/512 |
| 6,825,672 B1 * | 11/2004 | Lo et al. ..................... 324/533 |
| 6,906,526 B1 | 6/2005 | Hart et al. |
| 6,917,888 B1 * | 7/2005 | Logvinov et al. ............ 702/59 |
| 6,977,507 B1 * | 12/2005 | Pannell et al. .............. 324/534 |
| 6,980,007 B1 * | 12/2005 | Lo et al. ..................... 324/543 |
| 7,002,353 B1 * | 2/2006 | Lo et al. ..................... 324/534 |
| 7,005,861 B1 * | 2/2006 | Lo et al. ..................... 324/533 |
| 2004/0046570 A1 | 3/2004 | Teich |
| 2004/0251913 A1 | 12/2004 | Pharn et al. |

* cited by examiner

*Primary Examiner*—Vincent Q. Nguyen
*Assistant Examiner*—Hoai-An D. Nguyen
(74) *Attorney, Agent, or Firm*—Sterne, Kessler, Goldstein & Fox P.L.L.C.

(57) ABSTRACT

A system and method are used to determine connectivity and/or cable faults of a cable. A signal transmitting and receiving system is coupled to the cable. An analog-to-digital converter (ADC) coupled to the signal transmitting and receiving system. A TDR system coupled to the ADC and a memory, and a controlling system coupled to at least one of the ADC, the TDR system, and the signal receiving and transmitting system.

12 Claims, 6 Drawing Sheets

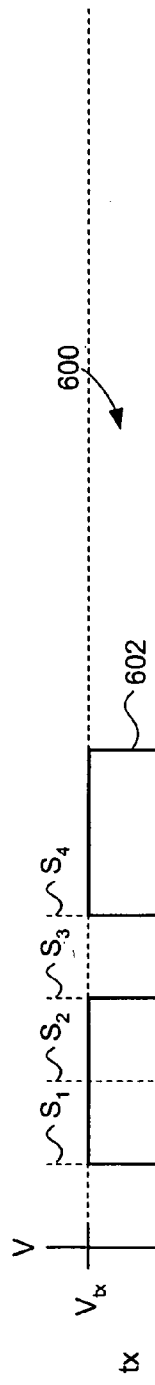
FIG. 6
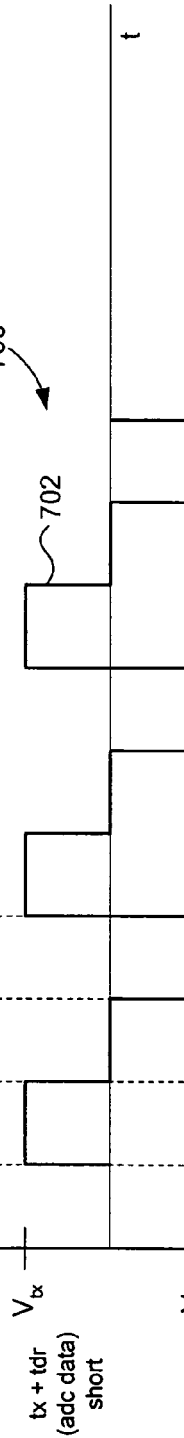
FIG. 7
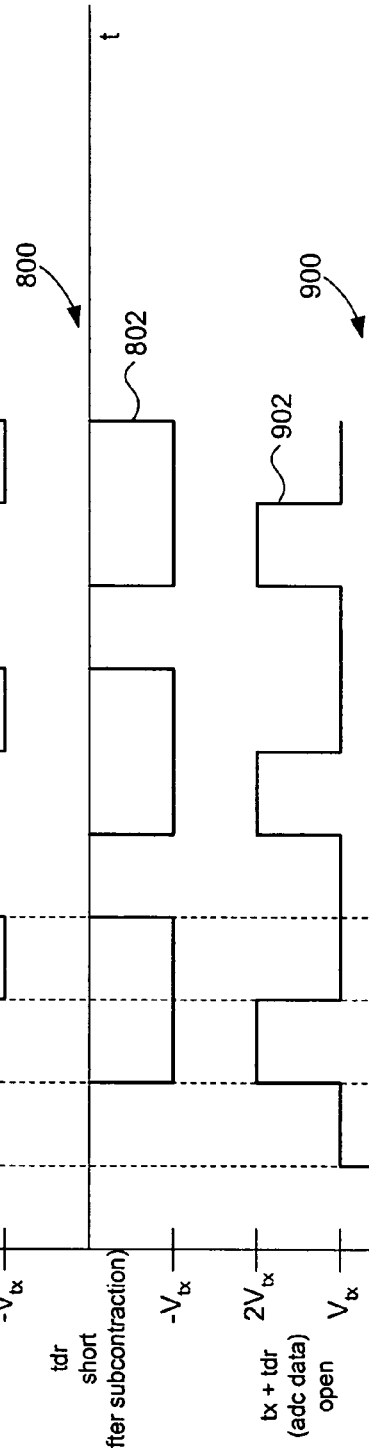
FIG. 8
FIG. 9
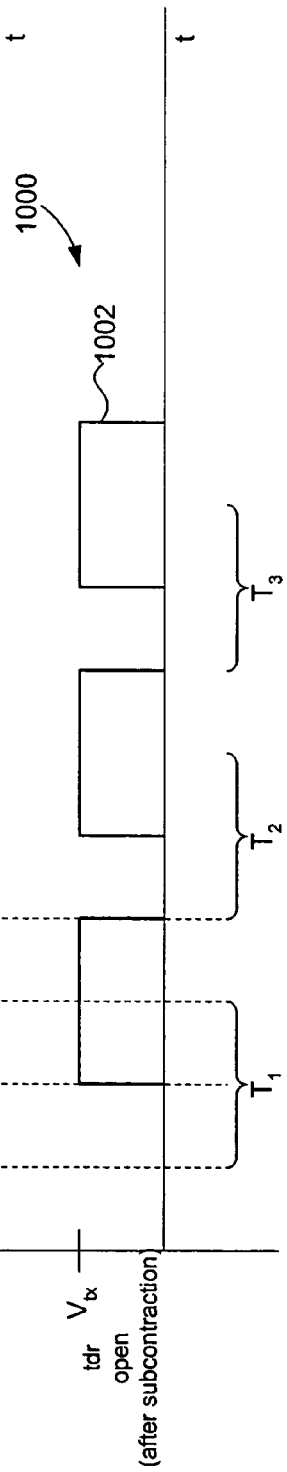
FIG. 10

CABLE DIAGNOSTICS USING TIME DOMAIN REFLECTOMETRY AND APPLICATIONS USING THE SAME

CROSS REFERENCE TO RELATED APPLICATIONS

This application claims benefit under 35 U.S.C. § 119(e) to U.S. Prov. App. No. 60/477,397, filed Jun. 11, 2003, entitled "Cable Diagnostics Using Time Domain Reflectometry and Applications Using The Same," which is incorporated by reference herein in its entirety.

This application is related to co-pending application Ser. No. 10/855,622, filed concurrently herewith, which is incorporated by reference herein in its entirety.

BACKGROUND OF THE INVENTION

1. Field of the Invention

The present invention is related to time domain reflectometry and applications for using the same.

2. Background Art

Time Domain Reflectometry (TDR) can be used to determine characteristics about a cable. The characteristics include, but are not limited to, length, status (open or short), connectivity (connected or not connected), energy flow, etc. Typically, in TDR one test wave is sent into a cable and characteristics about the cable are determined through detection (or not detecting) a return signal (e.g., a reflection). However, for longer cables a small amplitude pulse can become too attenuated to receive a reflection within tolerance for detection and a large duration pulse can overlap the reflection. Both of these situations can result in inaccurate determination about the cable.

Therefore, what is needed is a more accurate testing system and method for determining characteristics about a cable.

BRIEF SUMMARY OF THE INVENTION

An embodiment of the present invention provides a system comprising a signal transmitting and receiving system coupled to a cable, an analog-to-digital converter (ADC) coupled to the signal transmitting and receiving system, a TDR system coupled to the ADC and a memory, and a controlling system coupled to at least one of the ADC, the TDR system, and the signal receiving and transmitting system, the controlling system including a controller and one or more state machines that are used to control the TDR system.

Another embodiment of the present invention provides a system comprising a signal transmitting and receiving system coupled to a cable, the signal transmitting and receiving system transmitting signals having different durations and magnitudes that travel different distances in the cable, as a function of each signals' respective duration and magnitude, during each testing operation, an ADC coupled to the signal transmitting and receiving system, a TDR system coupled to the ADC and a memory, and a controlling system coupled to at least one of the ADC, the TDR system, and the signal receiving and transmitting system.

A still further embodiment of the present invention provides a system comprising a signal transmitting and receiving system coupled to a cable, the signal transmitting and receiving system transmitting a Link pulse signal, an ADC coupled to the signal transmitting and receiving system, a TDR system coupled to the ADC and a memory, the TDR system including a subtraction device that subtracts the transmitted Link pulse from an overlapped return signal to determine a reflection signal, and a controlling system coupled to at least one of the ADC, the TDR system, and the signal receiving and transmitting system.

A still further embodiment of the present invention provides a method for performing cable monitoring comprising the following steps. Transmitting a signal along a cable during a testing period. Monitoring for a reflection signal. Processing the reflection signal to determine cable characteristics. Determining whether another signal is being sent during the testing period. Repeating the above steps when the determining step determines another signal is being sent during the testing period. Ending the testing period if the determining step determines no other signals are being sent.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 6 shows a timing diagram of a transmitted signal, according to one embodiment of the present invention.

FIG. 7 shows a timing diagram of an overlapped signal when an open error is found in a cable, according to one embodiment of the present invention.

FIG. 8 shows a timing diagram of a reflection signal when an open error is found in a cable, according to one embodiment of the present invention.

FIG. 9 shows a timing diagram of an overlapped signal when a short is found in a cable, according to one embodiment of the present invention.

FIG. 10 shows a timing diagram of a reflection wave when a short error is found in a cable, according to one embodiment of the present invention.

Figure 1:
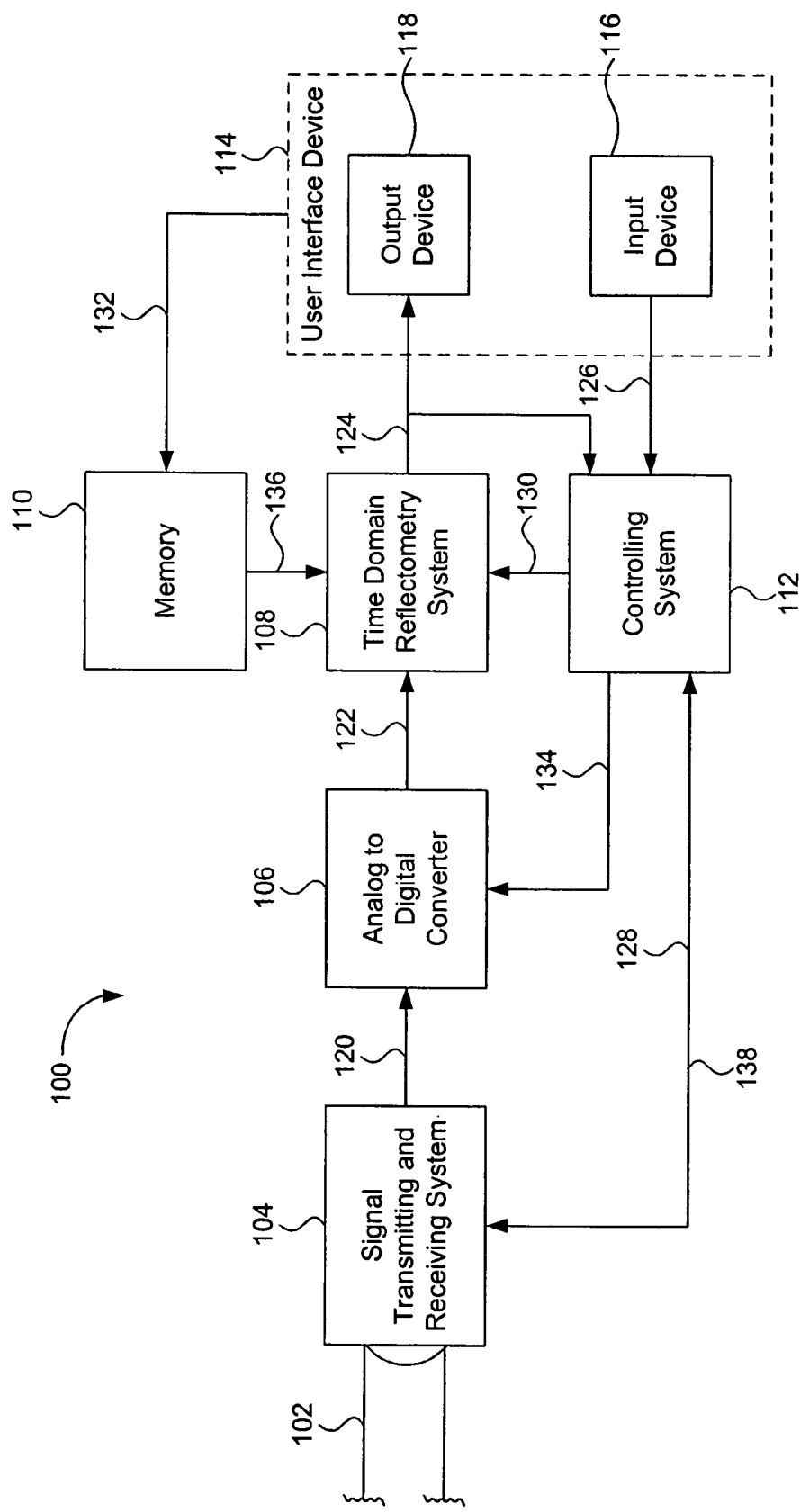
FIG. 1 shows a system, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview
Overall System
Exemplary Controlling System
Overview of TDR Detection
TDR Detection Of Connectivity Status Using A Link-Pulse
TDR Detection Using Multi-Pass (N-Pass) Approach
Exemplary Testing Operation
Multiple Cable Faults Detection
More Advanced Cable Diagnosis Using Reflection Coefficient
Timing Diagrams for TDR Error Detection Overview While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a method and system for performing cable diagnostics, such as determining open state, short state, and connectivity, more accurately than conventional systems and without taking up any additional overhead. The method and system use various signal transmitting schemes to perform the diagnostics. In one example, during a single pass scheme a Link pulse is used. In another example, during a N-pass scheme different signals having different magnitudes and durations are transmitted travel different distance within the cable during a single testing operation. Based on the magnitude and duration of each signal, the different distance is traveled by respective signals through the cable.

Overall System

FIG. 1 shows a system 100, according to one embodiment of the present invention. System 100 includes a cable 102, a signal transmitting and receiving system 104, an analog-to-digital converter (ADC) 106, and a time domain reflectometry (TDR) system 108, a memory 110, a controlling system 112, and a user interaction device 114. User interaction device 114 includes an input device 116 and an output device 118.

In one example, memory 110 can be a programmable memory device, such as a programmable register, or any other memory device that stores constant value until new values are received, as would become apparent to one of ordinary skill in the art.

In one example, user interaction device 114 can be a firmware, hardware, and or software that allow for inputting and outputting of information, such as a personal computer, or the like. In one example, input device 116 can be a keyboard, a disk drive, a CD ROM drive, or the like. In one example, output device can be a graphical user interface, a printer, a transmitter transmitting signals through a wireless or wired system or network, or the like.

Signal transmitting and receiving system 104, under control of controlling system 112, generates and transmits a signal along cable 102. For example, a square wave signal or pulse signal can be generate and transmitted along cable 102. A return or reflection signal is then received at signal transmitting and receiving system 104. An analog signal 120 is then transmitted to ADC 106 representing the received or reflected signal from cable 102.

ADC 106 produces a digital signal 122 from analog signal 120, which is received at TDR system 108. When enabled by controlling system 112, TDR system 108 processes digital signal 122 in order to determine characteristics about cable 102. For example, a determination can be made whether cable 102 has an open or short error, how long cable 102 is, if cable 102 is linked (connected) on two or more ends to devices, if cable 102 is linked without have any energy flow or having energy flow, etc. A result signal 124 based on the processing in TDR system 108 is transmitted to output device 118, which is used to generate an indication output to a user as to the state of cable 102. In one example, signal 124 is also transmitted to controlling system 112.

In one example, input device 116 allows a user generate a signal 126 to controlling system 112. In this example, controlling system 112 would then send a control signal 128 to signal transmitting and receiving system 104, which directs system 104 to perform a desired test. In another example, control signal 128 can be self-generated within controlling system 112, which will be described in more detail below.

In another example, signal 126 can also be used to direct controlling system 112 to generate a control signal 130, which will enable TDR system 108 and initiate processing of signal 122. In this example, input device 116 can be used to transmit new constant values to memory 110 via a signal 132 that will be used during the processing of signal 122. In another example, constant values stored in memory 110 need not to be updated or changed. In either case, a set of constant values 136 is either sent or accessed from memory 110 to TDR system 108.

In a further example, either through self triggering or receipt of signal 126, controlling system 112 can generate a control signal 134 that is used to control various aspects of ADC 106, as would become apparent to one of ordinary skill in the art.

In a still further example, controlling system 112 can also receive a signal 138 from signal transmitting and receiving system 104, such as when cable 102 appears to be disconnected (i.e., no link or link signal is detected) or not receiving energy.

In a still further example, a rising edge of the reflection in cable 102 is detected. This feature can be very important when there is an analog High-Pass Filter (HPF) (not shown) positioned before ADC 106 and cable disconnection auto-detection in the normal mode is desired. In this case, TDR can evaluate any positive reflection of a link pulse used as the test pulse in cable 102 due to the disconnection of cable 102. Because of the distortion of the HPF, subtraction of the ADC samples using a TDR internal look-up table for link pulse samples might not be possible. Thus, detection of reflection by looking at second positive transition due to the reflection may still be possible.

Exemplary Controlling System

Figure 2:
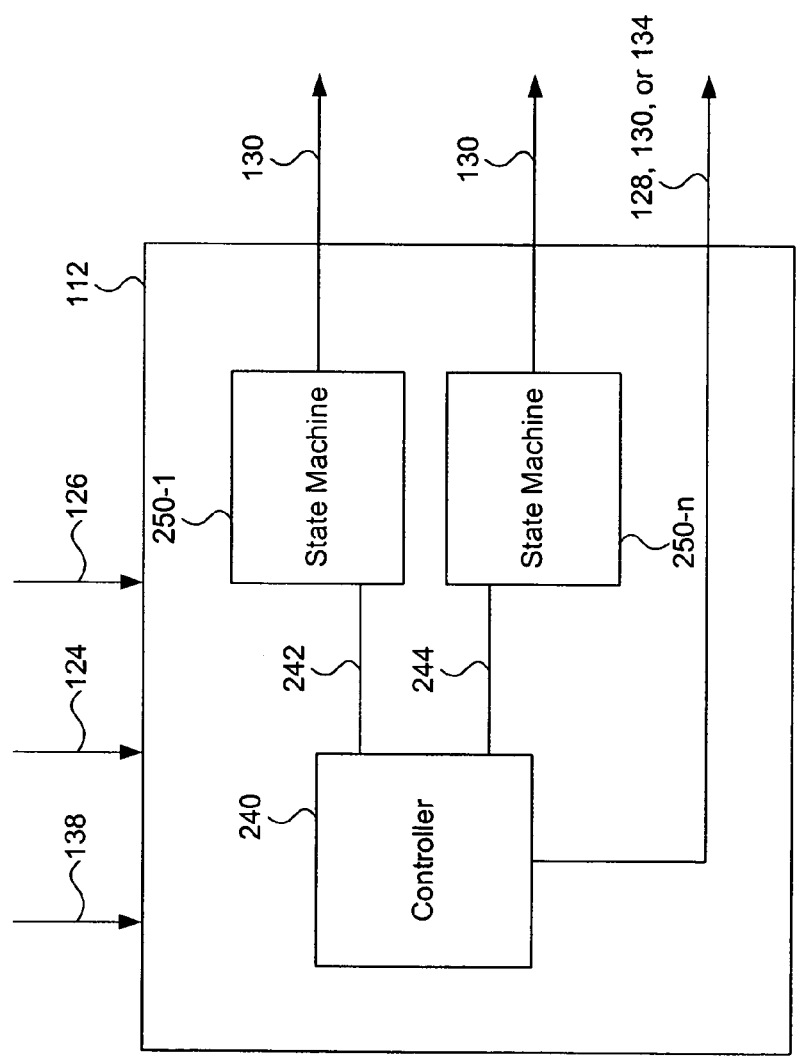
FIG. 2 shows an exemplary controlling system in the system of FIG. 1, according to one embodiment of the present invention.

FIG. 2 shows an exemplary controlling system 112, according to one embodiment of the present invention. In this embodiment, controlling system 112 includes a controller 240 and one or more state machines 250-n (n=1, 2, 3 . . . ). Controller 240 determines whether a user has selected a mode, and if so, which mode a user has selected for system 100 to operate in. Depending on the mode, controller 240 can enable the one or more state machines 250 using one or more signals 242-n. If the user has selected a manual mode, controller 240 can enable TDR system 108 directly.

Another example controlling system is shown in a co-pending application, filed concurrently herewith, U.S. application Ser. No. 10/855,622, which is incorporated by reference herein in its entirety.

Overview of TDR Detection

In system 100, TDR detection can be based on two transmission line characteristics of cables: reflection coefficient and Velocity of Propagation (VOP).

In one example, a Reflection Coefficient (Rcoeff) can be defined using the following equation:

$$Rcoeff = \rho_L = V_{Reflected}/V_{source} = (Zl-Zc)/(Zl+Zc)$$

According to this approach, Zl is the load impedance at the termination of cable 102 and Zc is the characteristic impedance of cable 102. Also, $V_{reflected}$ is the voltage of the reflected wave and $V_{source}$ is the voltage of the transmitted wave. When there is an open (cable disconnected) in cable 102, Zl>Zc and there can be a reflection with the same polarity of the transmitting waveform. This can be shown as:

$$Z_L = \infty \text{ and } \rho_L = (\infty - Z_0)/(\infty + Z_0) = 1 \text{ (open error)}$$

When there is a short in cable 102, Zl<Zc and there can be a reflection with the opposite polarity of the transmitting waveform. This can be shown as:

$$Z_L = 0 \text{ and } \rho_L = (0 - Z_0)/(0 + Z_0) = -1 \text{ (short error)}$$

A determination can be made whether the reflection is above a noise threshold and an amplitude of the reflection, which can be used to further investigate the mismatch of the impedance due to different cable faults.

VOP is intrinsic to cable 102, and can be treated as a constant (e.g., for Cat-5 cable, the VOP=5 ns/m). Measuring the propagation delay of the reflection results in a determination of where along cable 102 an open or short exists as a function of distance. A timer and a synchronous logic circuit (not shown) can be used to measure propagation delay. The timer can be turned on when the transmitted waveform appears on cable 102 to be tested, and can be disabled after detection of a reflection. A timer counter number represents the propagation delay in terms of clock cycles, as is well known.

Analog and/or digital circuits, for example in a 10/100 transceiver (i.e., 10BaseT Compliance: IEEE 802.3 and 100BaseTX Compliance: IEEE 802.3u to allow 10 or 100 Megabit per second signal transmission), can be used to transmit and receive test pulses and return signals, respectively. In one example, the TDR function can be readily integrated in a 10/100 physical layer device (PHY). PHY is the lowest layer and it deals primarily with transmission of the raw bit stream over the physical transport medium. In the case of wireless LANs, the transport medium is free space. The PHY defines parameters such as data rates, modulation method, signaling parameters, transmitter/receiver synchronization, and the like.

TDR Detection Of Connectivity Status Using A Single Link-Pulse

According to one embodiment of the present invention, the TDR detection can be done using a 10 BT link pulse transmitted and received by system 104. Throughout this description, one example of a link pulse is the one described in the IEEE 802.3 standard, which is incorporated by reference herein in its entirety, however other link pulses can also be employed. The 10 BT link pulse can allow for auto-detecting the cable disconnection. This may be used for an IP Phone application, which can combine the TDR cable diagnosis and the auto-negotiation controller in 10/100 PCS logic.

Figure 3:
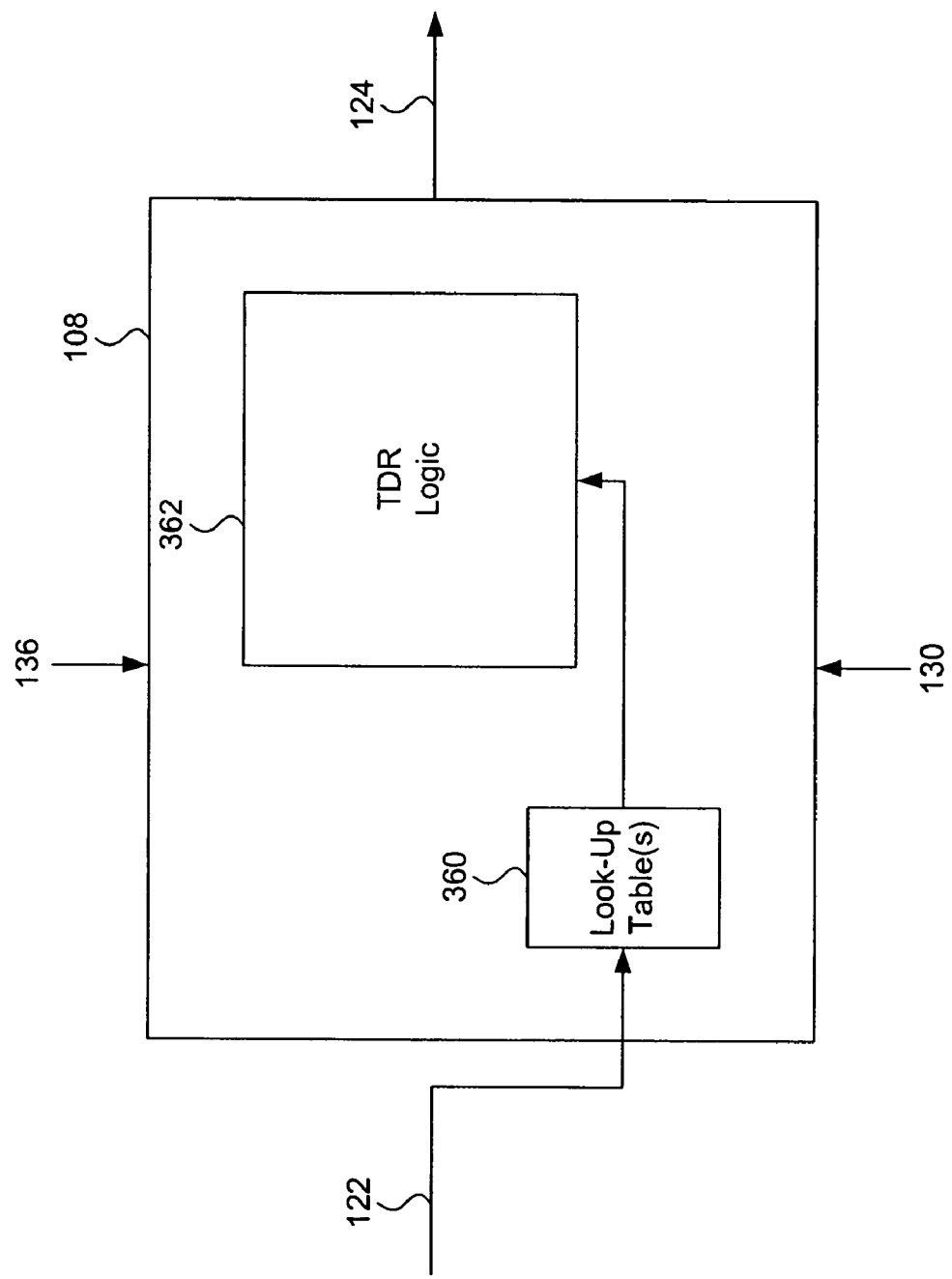
FIGS. 3 and 4 show first and second exemplary TDR systems of FIG. 1, according to embodiments of the present invention.

FIG. 3 shows a TDR system 308, according to one embodiment of the present invention. In this embodiment, ADC samples 122 of the link pulse are stored by a look-at table 360. In one example, look-up table 360 is hard-wired in TDR system 124 and coupled to TDR logic 362. In another example, two look-up tables 362-1 and 362-2 (see FIG. 4) are used. An example of TDR logic 362 can be found in FIG. 7 of a co-pending application, filed concurrently herewith, U.S. application Ser. No. 10/855,622, which is incorporated by reference herein in its entirety.

Figure 4:
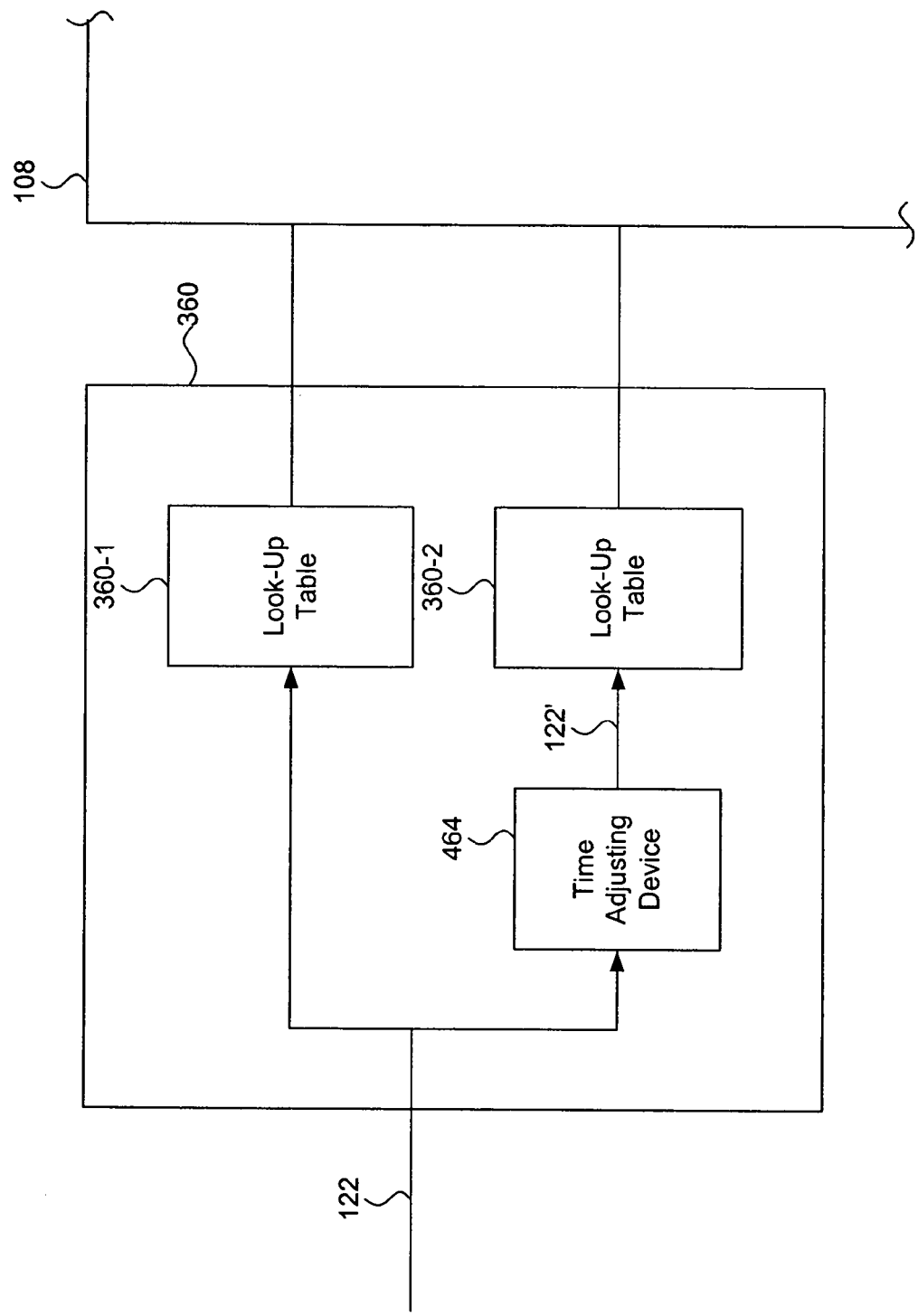

FIG. 4 shows a look-up-table device 360, according to one embodiment of the present invention. In this embodiment, look-up table device 360 includes first and second look up tables 360-1 and 360-2 and a time adjusting device 364. In this embodiment, first look-up table 360-1 is used for delay-mode TDR detection, which stores complete ADC samples 122 of the link pulse. Also in this embodiment, time adjusting device 364 and second look-up table 360-2 are used for self-sync TDR detection, which can use timing-adjusted ADC samples 122' of the link pulse. The use of two look-up tables 360 allows for a later subtraction operation of the link pulse from the ADC samples 122 and 122' in TDR logic 362 of the first transition of transmitting link pulse of the attached cable 102.

In this embodiment, the self-sync TDR detection approach allows for the correct timing of link pulse subtraction during TDR detection and it makes the timing window of TDR subtraction independent of the uncertainty of: (1) phase between transmitter clock and receiver clock, (2) the uncertainty of a transmitted ADC latency, and (3) the possible one-cycle skipping due to the asynchronous ADC sampling timing.

According to another embodiment of the present invention, a half-out mode is provided, during which a half-amplitude of the link pulse can be sent along cable 102 by system 104. This allows for more headroom of ADC clipping when there is overlapping between transmitting link pulse and its echo due to reflection. This also provides more signal-to-noise margin for TDR detection because a higher threshold can be set to suppress the subtraction errors due to any mismatch of real ADC samples 122 of link pulse and the link pulse data used in TDR system 108. The mismatch could happen due to the gain variation of system 104, ADC 106 INL (integral nonlinearity) noise, or the like. To accommodate this half-out mode, TDR system 108 automatically scales down the stored link-pulse data by half when this mode is enabled.

One way to achieve a substantially ideal signal-to-noise margin and a longest cable reach for TDR detection is to allow TDR system 108 to automatically switch the TDR threshold from short cable to long cable. It is to be appreciated that using a link-pulse can allow for more cable reach for the TDR because of its higher amplitude.

TDR Detection Using a Multi-Pass (N-Pass) Approach

According to another embodiment of the present invention, the architecture of system 100 allows for a multi-pass (N-pass) method of performing TDR detection on cable 102. One example of a N-pass approach uses two waves, a short duration square-wave pulse and a long duration and/or large amplitude square-wave or link pulse. These waves are sequentially transmitted during a single testing operation along cable 102 to detect a possible open or short on cable 102.

In this example, during a first pass a square-wave with first duration and a minimum TDR gain setting is sent by system 104 and reflections are received by system 104, which are used by TDR system 108 to detect any open or short within about 0 m to about 60 m of cable 102. During a second pass, a square-wave or a link-pulse with a second duration, which is longer than the first duration, is sent by system 104 and reflections are received by system 104, which are used by TDR system 108 to detect any open or short above about 60 m, e.g., from about 60 m to about 200 m. The second pass produces a distinguishable detectable reflection and a maximum TDR gain setting will be used for the pulse to achieve better noise margin for very long cables when the reflection is weak.

Thus, during the first pass, a first pulse is transmitted along cable 102. For example, a short square-wave pulse of about 32-ns is sent to detect any open or short within a cable distance less than the entire cable distance, e.g., at about 30 m to about 60 m. Using the short square-wave pulse, the overlapping between the transmitting waveform and the reflection may only happen when there is an open or short in cable 102 within about 0 m to about 4 m. TDR system 108 is used to subtract the transmitting waveform from the ADC sampled waveforms during a specific timing window (e.g., as shown in FIGS. 6-10, discussed below). Because this timing window is very short, the detection of the reflection without any subtraction after 4-m may only be required. This can minimize the subtraction of the overlapping and simplify the TDR detection by only detecting the reflection by itself for most of the cable length. This can also simplify and increase reliability of the TDR detection.

In one example, during the second pass a 10 BT (base ten) link pulse is sent as the second pulse. The 10 BT link pulse has much higher amplitude and a longer pulse width compared to the first pulse, which allow for detection of open or short when long cables (e.g., cables having lengths of about 140 m to about 200 m) are used. For the second pass, TDR system 100 may only start to look at a reflection after a TDR timer passes a programmable counter value, which allows masking out of any detection of reflections occurring between about 0 m to about 30 m. Thus, when using a timer, there may be no need to do any subtraction of the 10 BT link pulse from a ADC sample 122, which can make the detection very simple and reliable.

Exemplary Testing Operation

Figure 5:
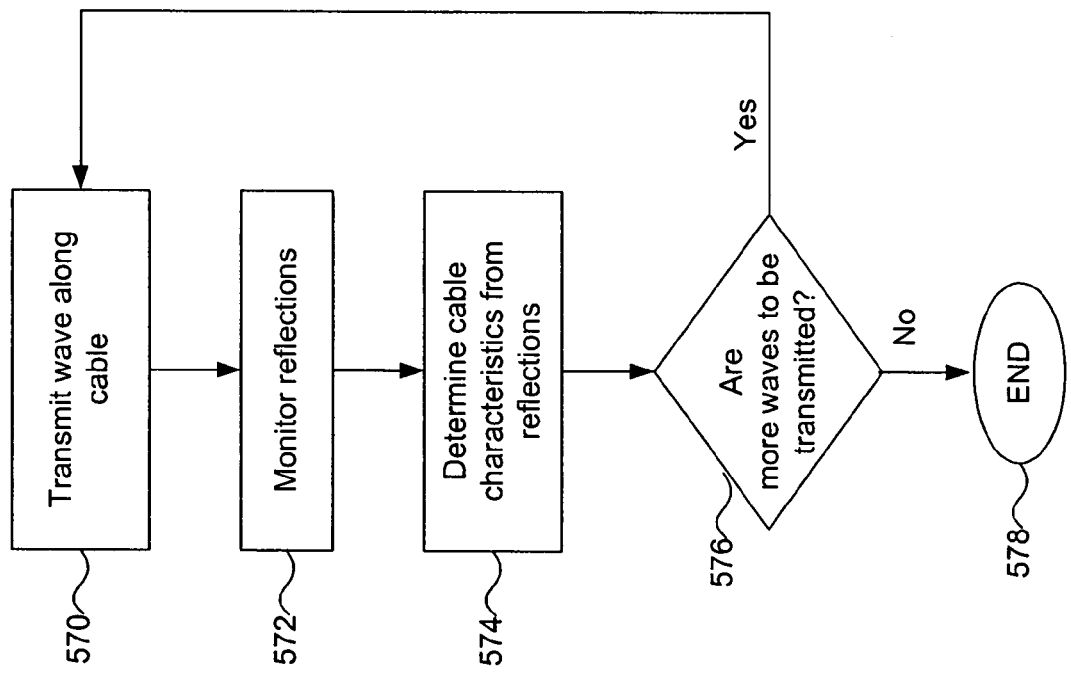
FIG. 5 is a flow chart depicting a method, according to one embodiment of the present invention.

FIG. 5 shows a flowchart depicting a method 500, according to one embodiment of the present invention. In one example, method 500 is performed by system 100 or the system found in co-pending U.S. application Ser. No. 10/855,622.

In step 570, a wave is transmitted along a cable. In various examples, as discussed above, this is a square-wave, a pulse wave, a Link pulse wave, or the like. In step 572, a reflection produced within the cable based on the transmitted wave is monitored (e.g., detected or sensed). In step 574, the sensed or detected reflection is processed. For example, the processing can be performed as described in detail above or as described in co-pending U.S. application Ser. No. 10/855, 622, to determine characteristics about the cable. For example, based on a known type of wave that was transmitted and parameters associated with the reflected wave, a short or open can be detected based on characteristics of the reflected wave compared to at least the transmitted wave and/or other values used in a TDR system, as discussed in detail above. In step 576, a determination is made whether more waves will be transmitted along cable 102. For example, this may occur when an N-pass method of operation has been initiated, as described in detail above. If yes, method 500 returns to step 570. If no, method 500 end at step 578.

Multiple Cable Faults Detection

According to one embodiment of the present invention, multiple cable fault detection is performed. Programming the starting point of a TDR detection window allows the TDR system 108 to ignore any reflection before that starting point. This is equivalent to the cable distance from where TDR starts to look for any reflection due to cable open or short. This feature may be used when there is some minor cable fault in near cable distance and the system still wants to look for other, possibly more serious cable faults, at longer distance.

More Advanced Cable Diagnosis Using Reflection Coefficient

According to another embodiment of the present invention, when a fault is detected, an amplitude of the reflection is also stored, which is closely related to the reflection coefficient discussed above. This data is used along with a TDR delay for further cable diagnosis. For example, the data is used with a cable model to calculate the reflection coefficient of the cable fault to look at the impedance mismatch of the cable and to investigate different kinds of cable fault scenarios.

Timing Diagrams for Exemplary TDR Methods

FIGS. 6, 7, 8, 9, and 10 show various timing diagrams of signals being sent and/or received along cable 102, according to various embodiments of the present invention. It is to be appreciated that all labels and descriptions found in FIGS. 6–10 are for those examples only, and are merely exemplary descriptions of what is being shown in the figures, as would be apparent to one of ordinary skill in the relevant arts. Other labels and/or descriptions for the operation of the various one embodiment of the present invention are contemplated within the scope of the present invention. It is also to be appreciated that, while only a square wave is shown, a link pulse or other signal are also contemplated within the scope of the present invention.

FIG. 6 shows a timing diagram 600 of a transmitted signal tx 602 that is sent along cable 102, according to one embodiment of the present invention.

Transmitted signal 602 has a magnitude of $V_{tx}$ and a pulse width of T ($T_1$, $T_2$, $T_3$, . . . ). In an example of a short duration signal 602 being used, T is about 30 ns, while in an example of a long duration signal 602 being used, T is about 100 ns. A long duration signal 602 will typically have a proportionally larger magnitude $V_{tx}$ as well.

Each dashed line S (S1, S2, S3, S4, . . . ) represents a sampling point of when a signal 120 from cable 102 is sampled at ADC 106 to form a digital signal 122 used in TDR system 108. Although only four sampling points are shown, it is appreciated that any number of sample points can be used depending on a total sampling period. For example, each dashed line S can represent 1 m of cable 102, which will allow a determination to be made where along cable 102 an error is found, if any.

FIG. 7 shows a timing diagram 700 of an overlapped transmit and reflection signal tx+tdr 702 when there is a short error on cable 102, according to one embodiment of the present invention. A short is detected because combined signal 702 goes to zero after a second sampling point and goes to $-V_{tx}$ after a third sampling point, indicating a reflection signal has a negative polarity (signal inversion). A negative polarity of a reflection signal indicates a short in cable 102, as was discussed above.

FIG. 8 shows a timing diagram 800 of a reflection signal tdr 802 when there is a short error on cable 102, according to one embodiment of the present invention. In one example, when a error is in the beginning of cable 102 and/or a long duration signal 602 is used, reflection signal 802 is determined after subtracting transmitted signal 602 from overlapped transmit and reflection signal 702. For example, this subtraction can be performed using a subtractor (not shown) in TDR system 108. In other examples where no overlap occurs, reflection signal 802 can be detected directly at system 104.

Using a subtractor may not be necessary in all circumstances, especially when a short duration wave (e.g., up to about 40 ns) is transmitted over a short cable length (e.g., up to about 60 m). However, when a longer duration wave (e.g., about up to 100 ns), for example a link pulse, is transmitted over a short or long (e.g., over about 60 m) cable length, a subtractor may be required in order to remove any overlap of a transmitted wave with a reflected wave. This is done to ensure that only the reflected wave is processed. For example, when using a one-pass approach with a link pulse, as described above, a subtractor may be required. Also, when doing a N-pass approach with longer duration waves, a subtractor might be required.

FIG. 9 shows a timing diagram 900 of an overlapped transmit and reflection signal tx+tdr 902 when there is an open error on cable 102, according to one embodiment of the present invention. An open is detected because combined signal 902 goes to $2V_{tx}$ after a second sampling point and goes to $V_{tx}$ after a third sampling point, indicating a reflection signal has a positive polarity. A positive polarity of a reflection signal indicates a short in cable 102, as was discussed above.

FIG. 10 shows a timing diagram 1000 of a reflection signal tdr 1002 when there is a short error on cable 102, according to one embodiment of the present invention. In one example, when a error is in the beginning of cable 102 and/or a long duration signal 602 is used, reflection signal 1002 is determined after subtracting transmitted signal 602 from overlapped transmit and reflection signal 902. For example, this subtraction can be performed using a subtractor (not shown) in TDR system 108, as discussed above. In other examples where no overlap occurs, reflection signal 1002 can be detected directly at system 104.

According another embodiment of the present invention, the detection of any cable fault may depend on two consecutive peak detections (i.e., the reflection amplitude is above the programmed threshold) with the same polarity. This can be very crucial for very robust TDR detection, especially when using square wave pulse for TDR detection.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
   a signal transmitting system that transmits first and second test signals into a cable each time a test is initiated, wherein,
      the first test signal has a first duration and a first amplitude and travels a first distance in the cable; and
      the second test signal has a second duration and a second amplitude that is larger than the first amplitude and travels a second distance in the cable;
   a signal receiving system that receives first and second return signals from the cable that correspond to the first and second test signals, wherein the first and second return signals are used during each test
   an analog-to-digital converter (ADC) that converts the first and second return signals to first and second digital signals;
   a time domain reflectometry (TDR) system that receives the first and second digital signals from the ADC and signals from a memory, wherein the TDR system uses the first and second digital signals and the signals from the memory to determine at least one of a state of the cable or a connectivity of the cable; and
   a controlling system that controls at least one of the signal transmitting and receiving systems, the ADC, and the TDR system, the controlling system including a controller and one or more state machines that are all used to control operation for the TDR system.

2. The system of claim 1, wherein the first test signal and second test signal are square wave signals.

3. The system of claim 1, wherein one of the first and second test signals is a square wave signal and another one of the first and second test signals is a link pulse signal.

4. The system of claim 1, wherein the TDR system is configured to perform a digital subtraction of at least one of the first and second test signals from at least a corresponding one of the first and second return signals including a reflected signal overlapped with the test signal.

5. The system of claim 1, wherein the second duration is longer than the first duration.

6. The system of claim 1, wherein the TDR system is configured to analyze the second return signal only after reaching a programmable counter value subsequent to transmitting the second test signal.

7. The system of claim 4, wherein the TDR system is configured to perform the digital subtraction during a specific timing window.

8. A method for performing a test during a testing period on a cable using cable monitoring of first and second reflection signals, which are both used to perform each of the tests during each of the testing periods, comprising:
   (a) transmitting first and second test signals along the cable during each test, the first test signal having a first duration and a first magnitude and is transmitted a first distance into the cable and the second test signal having a second duration and a second magnitude that is larger than the first magnitude and transmitted a second distance into the cable;
   (b) monitoring for receipt of the first and second reflection signals that correspond to the first and second test signals; and
   (c) processing the first and second reflection signals to perform each of the tests to determine a cable characteristic present during each of the testing periods.

9. The method of claim 8, further comprising producing a square wave as the first test signal and a link pulse as the second test signal.

10. The method of claim 8, further comprising producing first and second square waves as the first and second test signals.

11. A system for performing tests on a cable, comprising:
- a signal transmitting system coupled to the cable, wherein to perform each of the tests on the cable the signal transmitting system transmits first and second test signals having different durations and magnitudes that travel different distances in the cable as a function of each of the signals' respective duration and magnitude, wherein the magnitude of the second signal is larger than the magnitude of the first signal;
- a signal receiving system coupled to the cable, wherein during each of the tests on the cable the signal receiving system receives first and second return signals corresponding to the first and second test signals;
- an ADC coupled to the signal receiving system that receives the first and second return signals and generates respective first and second digital signals;
- a TDR system coupled to the ADC and a memory, the TDR system receiving and using the first and second digital signals to determine a characteristic of the cable; and
- a controlling system coupled to at least one of the ADC, the TDR system, and the signal receiving and transmitting systems.

12. A method for performing a test on a cable, comprising:
(a) transmitting first and second test signals along the cable, the first test signal having a first duration and a first magnitude and transmitted a first distance into the cable and the second test signal having a second duration and a second magnitude that is larger than the first magnitude and transmitted a second distance into the cable;
(b) before any analysis is performed receiving first and second reflection signals that correspond to the first and second test signals; and
(c) processing the first and second reflection signals to determine a cable characteristic present during each test.

* * * * *

UNITED STATES PATENT AND TRADEMARK OFFICE
CERTIFICATE OF CORRECTION

PATENT NO. : 7,164,274 B2
APPLICATION NO. : 10/855621
DATED : January 16, 2007
INVENTOR(S) : Pharn et al.

It is certified that error appears in the above-identified patent and that said Letters Patent is hereby corrected as shown below:

<u>Title Page</u>
Item[75] please replace "Huntingdon Beach" with --Huntington Beach--.

Signed and Sealed this

Fifteenth Day of May, 2007

JON W. DUDAS
*Director of the United States Patent and Trademark Office*